(12) United States Patent
Hovel

(10) Patent No.: US 6,548,420 B2
(45) Date of Patent: Apr. 15, 2003

(54) MEASUREMENT AND ANALYSIS OF MERCURY-BASED PSEUDO-FIELD EFFECT TRANSISTORS

(75) Inventor: Harold J. Hovel, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/103,306

(22) Filed: Mar. 21, 2002

(65) Prior Publication Data

US 2002/0110938 A1 Aug. 15, 2002

Related U.S. Application Data

(63) Continuation-in-part of application No. 09/770,955, filed on Jan. 26, 2001.
(60) Provisional application No. 60/285,156, filed on Apr. 20, 2001.

(51) Int. Cl.[7] .............................................. H01L 21/302
(52) U.S. Cl. ......................................... 438/745; 438/14
(58) Field of Search ........................... 438/745, 14, 16, 438/687, 692, 455, 107; 257/913, 679

(56) References Cited

U.S. PATENT DOCUMENTS

| | | | | |
|---|---|---|---|---|
| 5,578,854 A | * | 11/1996 | Chen et al. | 257/349 |
| 5,665,629 A | * | 9/1997 | Chen et al. | 438/384 |
| 5,955,654 A | * | 9/1999 | Stover et al. | 73/1.89 |
| 6,110,278 A | * | 8/2000 | Saxena | 117/95 |
| 6,153,495 A | * | 11/2000 | Kub et al.. | 438/459 |
| 6,194,290 B1 | * | 2/2001 | Kub et al. | 438/455 |
| 6,251,787 B1 | * | 6/2001 | Edelstein et al. | 438/692 |
| 6,297,155 B1 | * | 10/2001 | Simpson et al. | 438/687 |
| 6,429,145 B1 | * | 8/2002 | Hovel | 438/745 |

OTHER PUBLICATIONS

Cristoloveanu et al, *IEEE Elect. Dev. Letters*, —Nos., 102–104, Feb. 1992.

Hovel, *Proc. 1999 IEEE Inter. SOI Conf.* 180–181, (Oct. 1997).

D. Munteanu et al., *Electrochem. and Solid–State Letters*, 2 (5), 242–243, (1999).

* cited by examiner

Primary Examiner—John F. Niebling
Assistant Examiner—Olivia T Luk
(74) Attorney, Agent, or Firm—Scully, Scott, Murphy & Presser; Robert M. Trepp, Esq.

(57) ABSTRACT

Procedures, analysis techniques, and correction methods are presented for assessing the electrical properties of the Si layer of silicon-on-insulator substrates. Detailed analysis and equations are outlined in a computer algorithm written in Mathcad for both the linear and saturated regions of FET behavior.

20 Claims, 2 Drawing Sheets

MEASUREMENT AND ANALYSIS OF MERCURY-BASED PSEUDO-FIELD EFFECT TRANSISTORS

This patent application is a continuation-in-part of U.S. patent application Ser. No. 09/770,955, filed Jan. 26, 2001, for METHOD OF DETERMINING ELECTRICAL PROPERTIES OF SILICON-ON-INSULATOR WAFERS.

This patent application claims the benefit, under 35 USC §119 (e), of provisional specification No. 60/285,156, filed Apr. 20, 2001, for PROCEDURE FOR MEASURING AND ANALYZING MERCURY-BASED PSEUDO-FETS.

A "computer program listing appendix" is submitted herewith on a single CD-ROM disc, and duplicate copies thereof are submitted as Copy 1 and Copy 2, the contents of which are expressly incorporated by reference into this specification.

Each of Copy 1 and Copy 2 contains the following files, wherein each file has:

(1) a name of LinfetLOW5, a size of 150,660, bytes, and is written in Mathcad, available from MathSoft Engineering and Education, Inc. 101 Main Street, Cambridge, Mass. 02142.

(2) a name of SatFETMOD_5, a size of 80,313 bytes, and is written in Mathcad, available from MathSoft Engineering and Education, Inc. 101 Main Street, Cambridge, Mass. 02142.

BACKGROUND OF THE INVENTION

Silicon-on-insulator (SOI) starting substrate material can be used as an alternative to standard silicon wafers ("bulk silicon) to produce integrated circuits. The electrical properties such as electron and hole mobilities, surface state densities, fixed charge densities, and surface scattering properties in part determine how well the field effect transistors (FETs) will perform when this starting material is processed into integrated circuits. One method for assessing these starting wafer properties is to build FETs in the material using standard device processes like ion implantation, annealing, oxidation, diffusion, which are costly and time consuming.

An alternative is to use the buried oxide in the SOI structure as a gate oxide, place two electrodes on the Si surface as source and drain contacts, and use this as a "pseudo-FET." Electrical measurements using such pseudo-FETs have been described in, for example, IEEE Electron Device Letters Vol 13, pg 102, 1992, in *Electrical Characterization of Silicon-on-Insulator Materials and Devices,* Kluwer Academic Publishers, Boston, 1995, and in IEEE Transactions on Electron Devices Vol. XX, pg 1018, 2000. Similar measurements made using mercury electrodes have been described in Proc. 1997 IEEE International SOI Conference, pg 180, and in Electrochemical and Solid State Letters, Vol 2, pg 242, 1999.

However, all the prior art fails to present details on how these test structures are best made, how to account for the parasitic effects which limit their usefulness, how to set the correct voltage conditions for correct measurements, and do not present the complete mathematical analysis needed to obtain the electrical properties. In particular, the electrical behavior of the mercury-based FET (HgFET) differs from previous pseudo-FETS because of the surface treatment with hydrofluoric acid (HF) prior to contacting with the mercury and because of the unusual, part Schottky-like and part ohmic-like behavior of the mercury electrodes. The analysis equations presented in, for example, the IEEE Transactions article and Kluwer Academic Publishers book mentioned above do not take into account many of the parasitic effects and other unusual behavior associated with the HgFET.

Details of the HgFET preparation and measurements have been disclosed in U.S. patent application Ser. No. 09/770, 955, filed on Jan. 26, 2001, entitled "Method of Determining Electrical Properties of Silicon-on-Insulator Wafers" by the same inventor which is expressly incorporated herein by reference. However, this docket does not show the detailed procedures and analysis methods for analyzing measurements of these devices, and in particular, does not present an algorithm useable in computer analysis of such measurements. Without such an algorithm, analysis of the HgFET behavior including the parasitics to extract the electrical parameters from such measurements is extremely difficult, very time consuming, and very costly. Using the methods of the present invention overcomes these difficulties, and one detailed example is given for a mathematical algorithm written with MathCad which quickly and accurately extracts the electrical parameters.

SUMMARY OF THE INVENTION

Electrical measurements of liquid metal FETs, such as HgFETs, are made in several current-voltage regimes, specifically, the drain voltage is kept fixed at a low voltage and the gate voltage applied to the substrate side of the wafer is varied either in negative polarities (accumulation mode for the dominant p-type substrates) or the positive polarities (inversion mode). A mathematical algorithm is used which "imports" the electrical data either automatically or from a separate computer disk, and analyzes the data including the parasitic factors to extract the electrical parameters of the Si film. This procedure is carried out at different points in time after HF acid surface treatment which is necessary to obtain proper FET behavior. Certain parameters such as low field electron mobility are derived from the measurements at the early time periods, while the hole mobility, flat band condition, doping level, and buried oxide charge are obtained from the later time periods. The interface state density is taken at its minimum value regardless of when this occurs.

In a second procedure, the drain current versus drain voltage behavior is measured for a family of fixed gate voltages on the substrate. This family of data curves is called the saturated region of the FET. A second mathematical algorithm is described which analyzes the data in this second type of behavior to obtain the saturation threshold voltage, saturated mobility and transconductance, the drive current, and the output conductance. As in the first algorithm, the saturation region analysis algorithm may be included in an automated computer-controlled measurement system or used as "stand-alone" in which data is imported and analyzed separately.

Examples of detailed algorithms for accomplishing such data analysis are included in the invention.

DESCRIPTION OF THE EXAMPLE ALGORITHMS

The computer program listing appendix contains the following examples:

Example 1 is an algorithm written in Mathcad for analyzing the linear behavior of the pseudo-FET.

Example 2 is an algorithm written in Mathcad for analyzing the saturation behavior of the pseudo-FET.

DETAILED DESCRIPTION OF THE INVENTION

Silicon on insulator (SOI) wafers used for fabricating integrated circuits have the added feature compared to non-SOI wafers that the buried oxide (BOX) can be used as a gate oxide. Then two electrodes placed on the surface of the Si film can act as source and drain electrodes while the substrate on the opposite side of the BOX from the film acts as the gate of the FET, known as a pseudo-FET. Ideally the source and drain electrodes should form ohmic, low resistance contacts to the film and the substrate should behave as a gate "metal" with no voltage drop. In reality, the Hg electrodes, like the point contacts in a regular pseudo-FET, form leaky types of Schottky barriers while the gate electrode, being formed by a Si substrate, has a significant voltage drop. These parasitic effects must be accounted for in any analysis of the FET to extract accurate electrical parameters. A further parasitic effect is that the BOX may conduct current either through defects in the oxide or along the edges. This parasitic gate current causes strong errors in the measured mobilities for electrons which can also be corrected for using the methods outlined in this invention.

Figure 1:
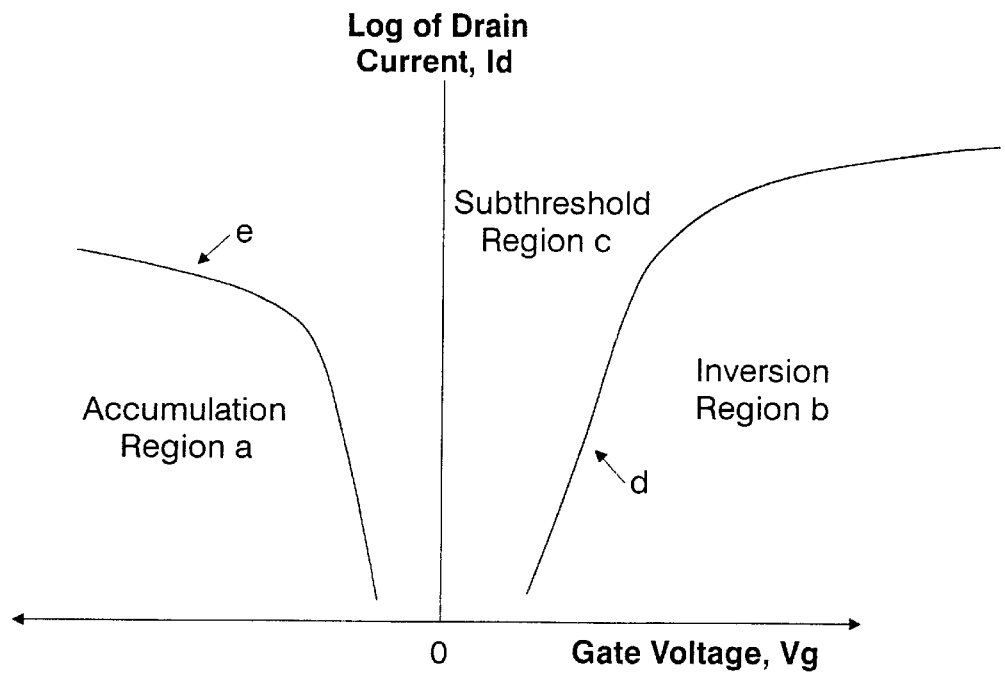
FIG. 1 is a graph of the drain current versus gate voltage in the linear region.

The log of the drain current Id versus gate voltage Vg of the pseudo-FET is shown in FIG. 1, where the drain voltage Vd is kept at a small value such as 50 to 300 millivolts and the gate voltage is swept from, for example, −10 volts to +15 volts or similar voltages. The accumulation region where current is due to holes is shown as a and the inversion region where current is carried by electrons is shown as b. The region 3 where the current increases exponentially is depicted as c. The current versus voltage d in the subthreshold region c has a slope known as the subthreshold slope. The curve e is the current of holes for negative gate voltages.

The curves of FIG. 1 may be analyzed using a computerized mathematical algorithm such as the example given as example 1. A SOI test sample is prepared with deposited Al on the substrate side which is annealed at 540 C or higher to make it an ohmic contact. The Si film surface is exposed to HF acid in water in a 1:10 mixture for 20 seconds followed by water rinse and $N_2$ blow-off, followed by placement on a Hg probe for source and drain Hg electrode contacting. The drain voltage is set to 0.2 volts and the gate voltage is swept from −7 to +11 volts in steps of 0.12 volts. Measurements are repeated at several time intervals, such as 2 minutes, 5 minutes, 20 minutes, 1, 2, 4, and 8 hours after the HF treatment to extract all the electrical data as the surface ions from the HF treatment dissipate.

EXAMPLE 1

MathCad makes all its calculations on incoming data using matrices. The first step in the example 1 program, therefore, is to import the data from the measuring instruments into a matrix called M in line 1. The thicknesses of the Si film and BOX are entered in lines 2 and 3 and the probe correction factor (PCF), which accounts for the geometry of the particular Hg-probe is entered in line 4. Also in line 4, the matrix M is modified to ensure that there are no currents below $1 \times 10^{-11}$ and that there are no negative values, so that the log of the current can be calculated in line 5. Line 6 calculates a new matrix N, which is the linear transconductance $Gm = (dI_D/dV_G)$, approximated as $\Delta Id/\Delta Vg$. Negative values are then converted to positive ones and a minimum value is established, both for ease of plotting. In line 8 the transfer characteristic defined as $G_T = I_D/G_M^{1/2}$ is calculated. Lines 9 through 13 make use of a technique in MathCad for finding the index of a particular point, in this case the peak value of the transconductance. The left side of lines 9 to 13 find the peak value of the hole transconductance and the right side of lines 9 to 13 find the peak value of the electron transconductance. Lines 14 through 17 are used to find the intercept of the current taken a point below and a point above these peak values. These intercepts represent the accumulation threshold voltage, known as the flatband voltage, and the inversion threshold voltage, known simply as the "threshold voltage". However, these intercepts must be corrected for the substrate parasitic voltage drop in order to be useable in extracting electrical parameters.

Figure 2:
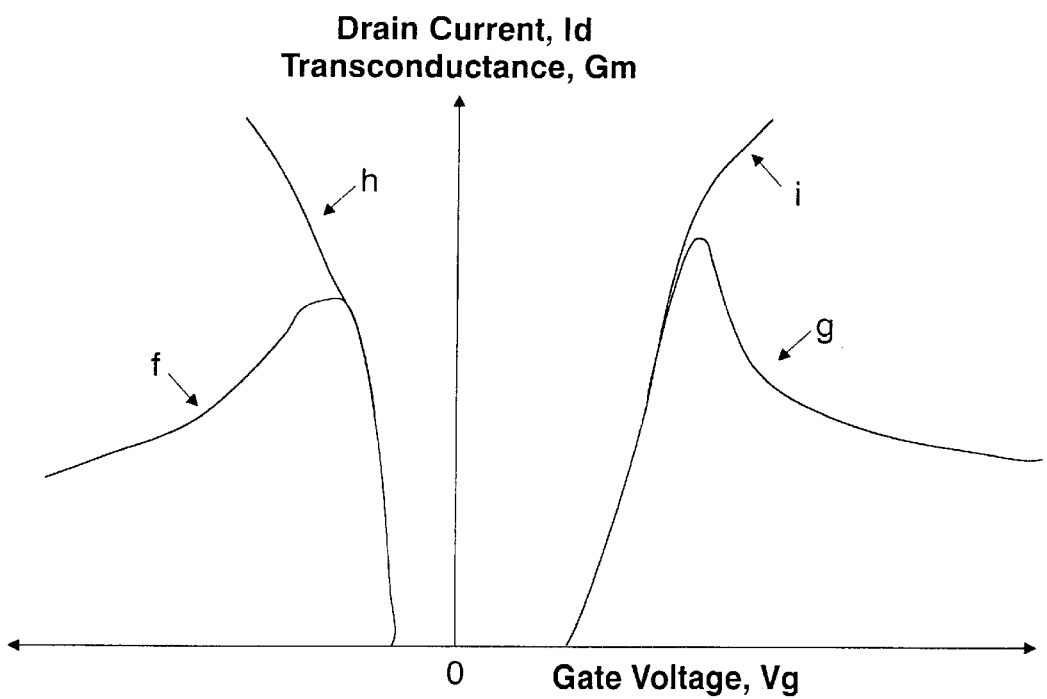
FIG. 2 is a graph of the transconductance and drain current versus gate voltage in the linear region.

Line 17 gives these intercepts for both holes and electrons. Line 18 is a plot of the transconductance and current and the straight line intercept for both the holes and electrons. The line 18 graphs are equivalent to the graph in FIG. 2, where f and g are the hole and electron transconductances, respectively, and h and i are the hole and electron drain currents, respectively.

The parasitic voltage drop in the substrate is corrected for in lines 19 to 24. In order to find the correction, Poisson's equation is solved in both the film and the substrate (in a separate algorithm not part of the example). The total charge in the substrate is then equated to the charge in the BOX, the charge in the film, and the surface ion charge to find the substrate voltage drop for each applied gate voltage, and this drop is added as a correction to the intercepts found from lines 9 to 17 to find the corrected, flat band voltage and threshold voltage. The correction takes the form of the Table in lines 19, where matrices P1 to P5 are set up with the correction factors; the left column of each matrix represents an applied gate voltage and the right side represents the substrate voltage drop to be added to the intercepts. Line 20 stacks the P matrices together, line 21 finds the correction factor to use for the flatband voltage then given in line 22, and lines 23 and 24 do the same for the threshold voltage. The correction for the flatband voltage in line 22 also contains the correction parameter Q CSI Qion/COX (CSI+ CITB) which accounts for the surface ion charge and interface state density on the film surface.

Figure 3:
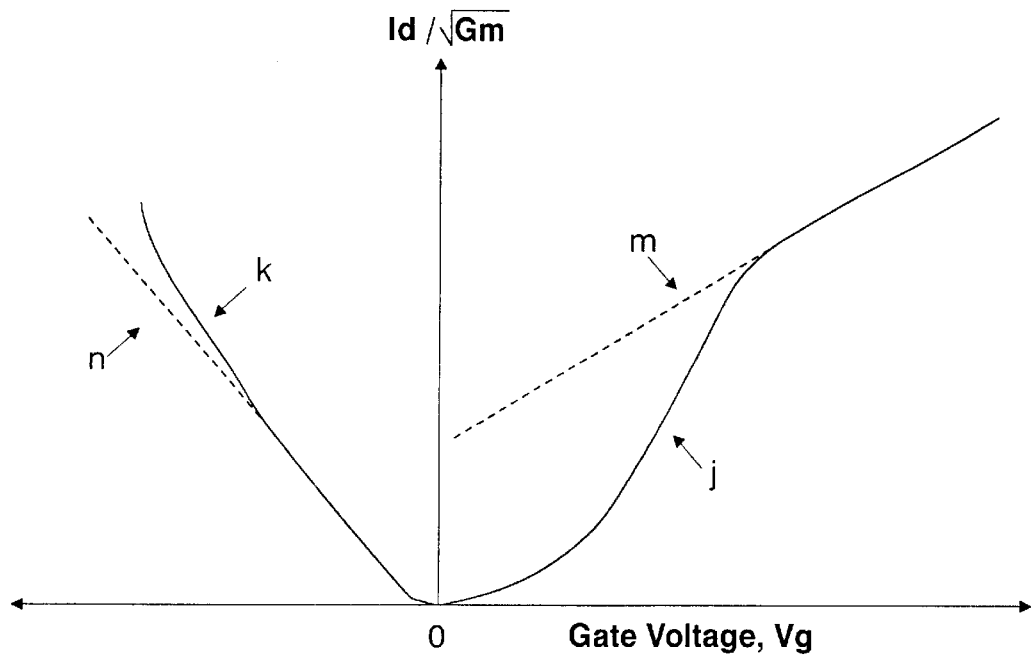
FIG. 3 is a graph of the drain current divided by the square root of the transconductance in the linear region.

Probably the most important electrical parameter for the Si film, obtained by the use of the HgFET combined with the analysis algorithm shown in example 1, is the low field mobility for the electrons. This mobility is obtained using the transfer characteristics shown in FIG. 3, where j and k represent the electron and hole transfer characteristic, respectively, and m and n represent straight line fits. The slopes of the straight line fits are used to find the mobilities from $\mu_{OE} = (\text{slope of } I_D/G_M^{1/2})^2/[(W/L)C_{OX}V_D]$ for electrons and $\mu_{OH} = (\text{slope of } I_D/G_M^{1/2})^2/[(W/L)C_{OX}V_D]$ for holes. However, the electrical scatter ("noise") in the measured data makes it necessary to calculate several straight line fits to find the one which is the best match to the data. In order to do this, 10 rms straight line fits to the straight portions of the transfer characteristics are calculated, such as fitting line m to transfer curve j in FIG. 3. The best goodness of fit between the calculated lines and the data is used to extract the mobility.

The extraction procedure begins by finding a starting index k0 in lines 25 to 28. This is done by creating a reference line with index points from index 132 to index 149, then finding a value of k0 in line 28 which gives a difference between the reference line and the data of less than 1%. If desired, the starting index k0 calculated automatically in lines 25 to 28 can be overridden in line 29.

Lines 30 through 83 in the algorithm of example 1 are used to calculate 10 straight lines with all the measured Vg points within the range k0 to k2. k2 is usually taken as the last measured point, having index 149. Each segment, such as lines 30 to 36, 37 to 42, etc., update the index k0 by one index value each time and calculate the resulting straight line fit. In addition, in lines 34, 41, 47, etc., a value of the scattering parameter "theta" is calculated. The final value of theta is used to correct the mobility later on in the algorithm for series resistance effects. Theta is obtained from the equation for the drain current:

$$I_D = C_{OX}(W/L)\mu_{OE}(V_G - V_{TH})V_D/[1 + \theta(V_G - V_{TH})].$$

θ describes the drop-off of the mobility as a function of the applied gate voltage. It contains two terms, an intrinsic term $\theta_I$ due only to the surface scattering and a parasitic term $\theta_I$ due to the series resistance: $\theta = \theta_I + (W/L)C_{OX}\mu_{OE}R_S$ where $R_S$ represents the series resistance present in the measuring circuit between the source electrode and ground.

The resulting starting index, goodness of fit (GOF), mobility, theta, slope na and intercept nb are stored in matrix MM, for example in lines 36 and 42, etc. The index of the straight line with the best goodness of fit is found in lines 84 and 85 and the final values for this best fit line are given in lines 86 and 87. Line 88 shows the entire matrix MM.

Lines 89 through 148 of example 1 calculate the best fit straight lines and resulting hole mobility for the accumulation region where hole flow dominates. The peak of the hole transconductance was already computed as A1 in line 13. A starting index A0 is chosen in line 89 together with a final index A3. Segments such as 90 to 96, 97 to 104, etc., then compute the straight line rms fits to the data by subtracting one index value from A3 for each segment. This is done because the straight line portion of the hole data occurs in this range of indices. In example 1, seven straight line fits are calculated for the hole transfer characteristic, and the data is stored in matrix PP for each segment in lines 96, 104, 112, for example. Lines 144 to 147 find the index for the line with the best fit and list the final values for hole mobility, hole theta, goodness of fit, and the slope and intercept. Line 148 displays the entire PP matrix.

Another valuable parameter obtained from the measured data is the subthreshold slope, the straight line tangent to the drain current versus gate voltage shown as curve d in region c of FIG. 1. This slope is used to extract the interface state density DIT and the doping level Na in the film. Lines 149 to 258 are used to calculate the best straight line fit. There are 20 separate straight line fits calculated, more than in previous fittings since the current varies exponentially in the subthreshold region over a wide current range. In line 149, an approximation to the expected value of the subthreshold slope (SSL) is calculated. The low current regions of the current in the subthreshold region always exhibits slope values much too low or much too high. The approximate values SSA in line 149 is used to disregard these spurious points.

The straight line fits are calculated in segments, for example, lines 150 to 155, lines 156 to 160, etc. The first index for calculating the straight line fits begins at A2 minus R1 in line 150, where A2 is the peak position of the linear transconductance as calculated in line 13 and R1 is chosen as 20, but other values for R1 can be chosen as wanted. Lines 151 to 154 calculate the straight line fit to the logarithm of the current and find the resulting goodness of fit, the slope and intercept, and the subthreshold slope SSL (by convention, written as volts per decade and so is actually the inverse of the fitted line slope to the current values, $SSL = (\ln 10)(d \ln I_{DS}/dV_G)^{-1}$). These parameters are stored in a matrix RR, for example in lines 155, 160, 165, and so forth. Each line-calculating segment advances the index by one value until the 20 straight line fits have been calculated, ending at line 255. Line 256 sets all the spurious, very low values of the GOF to unity and all the spurious, low values of the subthreshold slope less than SSA (from line 149) to unity. Lines 257 and 258 find the index of the minimum value of the subthreshold slope from all the calculations stored in matrix RR, and line 258 shows a portion of the matrix RR.

In line 260, the charge in the buried oxide and the interface state density at the BOX/Si film interface are calculated. Lines 261 to 264 solve a transcendental equation for the doping level. In line 261, a matrix NAG is established, and a so-called "bulk potential" $\Phi_F = (kT/Q)\ln NAG/N_I$. In line 262 another matrix NAC is calculated. A second equation in line 262 substracts NAG from NAC. The doping level is the value which makes this difference a minimum. In lines 263 and 264 the index of this minimum is found and the corresponding doping value is shown.

While lines 261 to 264 calculate the doping level automatically, lines 265 and 266 allow for a hand calculation of the doping level in case greater accuracy is needed or in case the value falls outside of the values used in matrices NAG and NAC.

Lines 277 to 284 calculate values of theta in the inversion region and find the average value for use in correcting the calculated mobility. Although values of theta were already calculated in lines 30 through 83 for the straight line fits to the transfer characteristic, it is convenient to repeat the calculation again in lines 277 to 284 with the correct value of VCPT, which is the intercept on the voltage axis of the best fit line, and also any number of theta calculations can be averaged for more accuracy by a simple change of the starting index and finish index k0 and kk0 in line 227. The standard deviation is also calculated in line 284 and is a measure of how close the data curve is to a straight line.

Lines 285 to 289 are used to set up the scales of the graphs on page 14 of example 1. S1 and S2 in lines 285 to 287 are used to set the maximum vertical scales for the hole transfer characteristics and hole transconductance graphs, the left two graphs in lines 293 and 295. S3 and S4 in lines 288 and 289 set the maximum vertical scale for the electron transfer and Gm curves, the right side of lines 293 and 295.

Line 290 calculates the corrected mobility MOBO from the measured mobility MOBE, the calculated average value of theta, and the intrinsic value of theta. To find the intrinsic value of theta, to input in line 282 as THETAI, more than 80 SOI substrates were measured and averaged to find THETAI. These test substrates did not exhibit significant gate current and therefore had no series resistance effects. To find the rate of mobility fall-off with theta (where 140 is used in line 290), devices with varying degrees of gate current were measured with resistances placed in series with the source, allowing the measurement of apparent mobility and apparent theta, and yielding an average value of 140 for the slope of mobility versus theta.

Lines 291 to 297 of example 1 are a compilation of all the calculated results. The device title, file identity, gate current, time after HF acid treatment and the probe ID are shown in line 291. The Si and BOX thicknesses are listed in line 292. A graph of the drain current versus gate voltage is shown in line 293, left side, while line 293 right side is an expanded view of the subthreshold region. Line 294 is an input field for indices i and g used in making the plots. Line 295 shows the transconductance, current, and best straight line fit for holes (left side) and electrons (right side). Line 296 shows the transfer characteristics and straight line fits for holes (left side) and electrons (right side). The calculated electrical parameters obtained by the analysis outlined in the entire algorithm are given in line 297.

Figure 4:
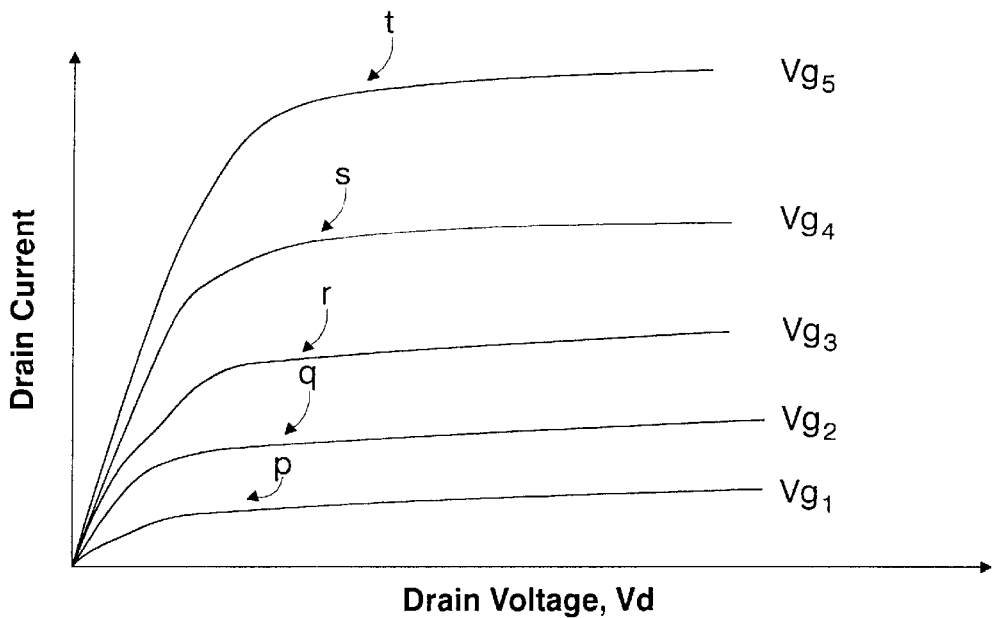
FIG. 4 is a graph of the drain current versus drain voltage for several values of gate voltage.

Another method for assessing the electrical properties of the Si film is to measure the drain current versus drain voltage at fixed values of gate voltage, known as the saturation characteristics. The resulting curves are shown in FIG. 4, where 5 curves are shown at fixed gate voltages of Vg1 through Vg5. The key parameters to be extracted from the saturation curves are the saturation threshold voltage, the drive current, the saturation transconductance, the effective linear mobility, the saturation mobility, and the output conductance.

An example of a measurement of the saturation characteristics includes exposing the Si film surface with HF acid in water in a 1:10 mixture followed by rinsing and blow-off with clean gas, followed by contacting the Si surface with two Hg electrodes acting as source and drain electrodes of an FET, and contacting the Al-coated and annealed substrate side as the gate electrode, applying fixed gate voltages of 0 to 11 volts in 1 volt increments, and sweeping the drain voltage from 0 to 20 volts in 0.2 volt increments. This saturation measurement may be intermingled at different times with the linear region measurements as discussed in Example 1, such that both types of FET measurements are made on the same prepared test sample.

EXAMPLE 2

An example of an algorithm written in Mathcad for analysis of the saturated region is given in Example 2. Line 1 is a title line. The BOX thickness, probe correction factor, time, intrinsic value of theta, starting value of Vg, and Vg increment are written in lines 2 through 4. The data is imported into a matrix M in line 3 and the data is displayed in the graph of line 5. The analysis begins by determining the saturation threshold voltage, since most of the film electrical parameters are referenced to this voltage. The threshold voltage in turn is found from the solution to the equation: $I_{DSAT2}/I_{DSAT1}=(V_{G2}-V_{TSAT})^2[1+\theta(V_{G1}-V_{TSAT})]/(V_{G1}-V_{TSAT})^2[1+\theta(V_{G2}-V_{TSAT})]$ where $I_{DSAT1}$ and $I_{DSAT2}$ are the currents at two different gate voltages $V_{G1}$ and $V_{G2}$ and $V_{TSAT}$ is the saturation threshold voltage. The saturation drain currents $I_{DSAT}$ are the current values just above the "knee" in each Id versus Vd curve, for example, p,q,r,s, and t of FIG. 4. They can be easily determined by finding the voltage at the knee beyond which the curve becomes nearly flat. This voltage at points p,q,r,s, and t in FIG. 4 is known as the saturated drain voltage $V_{DSAT}$.

In the Example 2, the VDSAT for each curve is found by computing the output conductance for each curve, defined as $G_{OUT}=dI_D/dV_D$, approximated as $\Delta ID/\Delta VD$. Lines 6, 7, and 8 in example 2 calculate the output conductances for each of the curves, which are then displayed in the graph of line 9. The knee of each curve is approximately the point at which the output conductance reaches its lowest value. However, samples with widely varying thicknesses, BOX charge, and other features can have this knee at widely varying voltages. Therefore, lines 10 through 70 represent plots of each of the eleven curves shown in the graph of line 5. Each segment such as 10 through 14, 15 through 19, 21 through 25, etc., allows for an accurate calculation of $V_{DSAT}$ and $I_{DSAT}$ for each curve. This is done by choosing indices a and b (line 10, line 15, line 21 for example) which represent indices for voltages points higher than the knee voltage $V_{DSAT}$. The output conductances are averaged between these points as in line 11. The index value for the first voltage in which the output conductance becomes less than twice this average is found in line 12. This index is taken as the index for $V_{DSAT}$ and $I_{DSAT}$. This procedure is followed in the other ten segments (lines 26 to 30, 32 to 36, etc.) until the values of $V_{DSAT}$ and $I_{DSAT}$ are found for all the curves. Lines 20, 31, 42, 53, 64, and 70 show graphs of each output conductance versus drain voltage. Lines 71 through 74 create a matrix N consisting of the fixed gate voltages and calculated $I_{DSAT}$ values for each curve. Line 74 also creates a third column in matrix N which is the square root of the currents and a plot of the square root of $I_{DSAT}$ versus gate voltage is shown in line 75. Since current depends approximately quadratically on gate voltage in the saturation region, this curve should be a straight line with an intercept approximately equal to the saturation threshold voltage.

An accurate value for the saturation threshold voltage which takes the value of theta into account is calculated in lines 76 to 106. In line 76, a matrix of 300 voltages $Vt_m$ is created. Lines 77 to 79 form a segment in which the threshold voltage is calculated for the set of the first two curves. The value of $I_{DSAT2}/I_{DSAT1}$ is recorded as R1 in line 77. A matrix of values of $(V_{G2}-V_{TSAT})^2[1+\theta(V_{G1}-V_{TSAT})]/(V_{G1}-V_{TSAT})^2[1+\theta(V_{G2}-V_{TSAT})]$ is then created as $A1_m$ for the 300 values of $Vt_m$. Another matrix $C1_m$ consists of the difference between R1 and the $A1_m$ values. Lines 78 to 79 find the minimum value of C1 and its index D1. The threshold voltage is $Vt_m$ at index D1 which is recorded in the storage matrix NN.

Lines 80 to 82, 83 to 85, 86 to 88, 89 to 91, 92 to 94, 95 to 97, 98 to 100, 101 to 103, and 104 to 106 follow exactly the same procedure for the other 9 pairs of Id versus Vd curves in the graph of line 5. All the calculated threshold voltages are stored in matrix NN, which is later displayed in line 113. However, some of these calculated values of saturated threshold voltage contain parasitics which render them inaccurate. Therefore, lines 107 to 114 are used to disregard the inaccurate values, which occur at the lower values of gate voltage Vg, and average the remaining values to obtain the most accurate number. The matrix XY in line 108 is used to store the averages and standard deviations of the calculated $V_{TSAT}$ values. YY1 averages the values for 9 sets of curves; YY2 averages 8 sets of curves, YY3 averages 7 sets of curves, and so forth. In line 109, an index k0 is found using the condition that the standard deviation is less than ⅓ of the average value, and the accurate, averaged saturation threshold voltage $V_{TSAT}$ is then the calculated average value given in line 110.

Occasionally, samples with unusual sets of curves can give spurious results by this automatic method of calculation; for example, the criterion of the standard deviation being less than ⅓ the calculated average may not be adequate. Therefore lines 111 to 114 give an option to override the automated value and calculate the $V_{TSAT}$ "by hand." The matrix XY is shown in line 111. By inspection of XY, the indices k0 and k1 for averaging the individual threshold calculations can be determined. To do this, the matrix VV is created with these chosen indices in line 114 and the average value VTS is calculated. In most cases, VTS is identically equal to $V_{TSAT}$ calculated automatically.

Two values of mobility can be obtained from these curves of Id versus Vd shown in line 5. The mobility in the saturated region can be obtained from any all of the individual curves together with the corresponding gate voltage; for example: $\mu_{SAT1}=I_{DSAT1}PCF/(W/L)C_{OX}(V_{G1}-V_{TSAT})^2$. Another mobility known as the effective mobility $\mu_{EFF}$ also known as the linear mobility $\mu_{LIN}$ is obtained from the output conductance in the linear region at the origin, $\mu_{LIN}=(dI_D/dV_D)PCF/(W/L)C_{OX}(V_G-V_{TSAT})$. The linear mobility is calculated for each curve in the graph of line 5 in lines 116 to 121. The saturation region transconductance is calculated for each pair if $I_{DSAT}$ values in lines 122 to 125. Lines 126 to 129 calculate the output conductance in the nearly flat, saturated region for a particular set of index values. The starting index R0 in line 126 is taken as the index plus 12 of $V_{DSAT}$ for the 7th gate voltage curve in the graph of line 5, and the final index is R0+20 as shown in the submatrix in line 127. The output conductance SIGAVG given in line 129 is the average of the values between R0 and R0+20.

The last page, 10, of example 2 collects all the calculated data in one convenient place. Line 130 gives the wafer title, file ID, and gate current. Line 131 shows the BOX thickness, the PCF, and the intrinsic value of theta used in the calculations. In order to compare different samples under the same conditions with different BOX thicknesses and threshold voltages, a parameter XX is established in line 131 which is 7 volts normalized to a BOX thickness of 120 nanometers. This allows us to compare all samples at the same inversion charge, which is proportional to the field given by Vg–Vt divided by BOX thickness. XX is then the value of Vg–Vt for extrapolation to calculate such parameters as transconductance and drive current. The actual gate voltage for the extrapolation is VGD=XX+VTSAT as given in line 132. It is necessary to find the measured Id versus Vd curves with gate voltages just above and just below this extrapolated, normalized value; therefore the matrix VV is set up in line 132 which contains the Vg values, and in line 133, the index j is found for the gate voltage just above VGD. Lines 134 and 135 then calculate the saturation transconductance at this extrapolated, normalized gate voltage.

In line 136, a matrix USAT of saturation mobilities is calculated, where the number 5.71 is the W/L term for the particular Hg probes used in making the measurements. Lines 137 to 140 list the calculated electrical parameters, including the drive current which is the drain current at the extrapolated value of gate voltage, the linear conductance (the output conductance near the origin) and both ULIN and USAT. Both ULIN and USAT are given at the j index found in line 133; they do not need to be extrapolated because they are both only slowly varying functions of gate voltage. The output conductance in line 139 is the slope calculated in lines 126 to 129 for the 7th curve in the family of curves shown in line 5 and repeated in line 141. The entire page 10 can be outputted and stored, since it contains all the parameter calculations made in the algorithm.

Both the measurement and the analysis algorithms can be easily computer-automated such that after the sample is prepared and placed on the Hg probe and contacted on the back, the computer automatically applies the desired drain and gate voltages at chosen intervals of time and the calculated electrical parameters from the analysis algorithms are stored and/or outputted as desired. The measurement is made at different time intervals because of the changing surface ion and surface state density and the changing current-voltage behavior of the Hg (Schottky-like) contacts. These changes determine that the calculated electrical parameters will also be different at different times. The electron (inversion region) low field, linear, and saturation mobilities are taken at their peak values measured during the first hour, and the subthreshold slope is taken at its minimum value. The hole mobility, flat band voltage, and doping level are taken from long time periods near the end of the overall measurement period.

If desired, the saturation curves equivalent to FIG. 4 and lines 5 and 141 of example 2 can be obtained for holes in the accumulation region by reversing the polarities of the drain voltage and gate voltage. Analysis procedures equivalent to example 2 can then be used to analyze the saturation parameters for holes as was done in example 2 for electrons. Analysis of hole parameters in the linear region, FIG. 1, was already carried out in example 1.

It will be apparent to anyone skilled in the art that analysis programs for analyzing pseudo-FETs and HgFETs in particular can be written in other programming languages besides MathCad. All such programs, however, must include the same features as outlined in the procedures and analyses algorithms presented in this invention. Measurements must include surface preparation and electrode contacting, application of correct ranges of drain and gate voltages, recording of the resulting current values, analysis of the linear and saturation behavior of the FET to obtain the electron and hole mobilities, drive currents, transconductances, BOX charge, interface state charge, and doping levels. All analyses must account for the parasitic effects as discussed herein in order to obtain accurate parameters. The examples 1 and 2 described herein above are not unique, but any other algorithms that yield equivalent electrical parameters must include all the procedures and steps outlined in examples 1 and 2. Some programming languages may find the indices more easily and with less steps than does MathCad, resulting in algorithms which are shorter and more compact than those shown in examples 1 and 2, but the essential features of such alternative algorithms must be the same as examples 1 and 2 in order to be complete.

While several embodiments and variations of the present invention for a procedure for measuring and analyzing mercury-based pseudo-FETS are described in detail herein, it should be apparent that the disclosure and teachings of the present invention will suggest many alternative designs to those skilled in the art, and that the present invention is applicable to all types of liquid metal-based pseudo-FETs, with liquid metals such as gallium, gallium/indium, gallium/indium/tin, gallium/mercury and indium/mercury.

Having thus described my invention, what we claim as new and desire to secure by Letters Patent is:

1. A method for analyzing and determining electrical parameters of a liquid metal-based pseudo-FET made on a silicon-on-insulator substrate comprising:

creating an ohmic gate contact to a substrate side of a test sample of the silicon-on-insulator substrate;

treating a Si film surface of said test sample to remove native oxide and reduce surface states;

contacting said Si film surface with two liquid metallic electrodes which act as source and drain electrodes;

placing a low bias drain voltage in the range of 50 to 300 millivolts between said source and drain electrodes;

placing a varying voltage bias on said gate contact, varying from a negative value greater than an FET flat band voltage to a positive value greater than an inversion threshold voltage;

recording values of the drain current at each said gate voltage; and performing an analysis of said drain voltage versus gate voltage measurements to determine electrical parameters of the liquid metal based pseudo-FET made on a silicon-on-insulator substrate.

2. The method of claim 1, for analyzing and determining electrical parameters of a mercury-based pseudo-FET on a silicon-on-insulator substrate.

3. The method of claim 1, wherein the analyses include:

calculating transconductances in both a negative accumulation region voltage polarity and a positive inversion region voltage polarity.

4. The method of claim 3, wherein the analyses include:

calculating intercepts of an RMS fit to said drain currents at peak values of the transconductances to obtain flat band and inversion threshold voltages.

5. The method of claim 4, wherein the analyses include:

calculating transfer characteristics by calculating values of said drain current divided by a square root of said transconductances for each said voltage polarity;

calculating RMS fits to said transfer characteristics for multiple ranges of said gate voltage;

computing intercepts, slopes, and goodness of fit lines of each said RMS fit to said transfer characteristics;

determining a best goodness of fit line;

calculating hole and electron low field mobilities from said best goodness of fit line;

calculating a value of theta for each said gate voltage, drain current, and transconductance combination;

measuring drain current versus drain voltage at fixed values of gate voltage to determine saturation characteristics.

6. The method of claim 3, in which a subthreshold slope for said inversion region voltage polarities is found by fitting RMS straight lines to the drain current versus gate voltage for values of said gate voltage less than said inversion threshold voltage and determining an RMS fit straight line with a steepest slope corresponding to a lowest subthreshold slope number.

7. The method of claim 5, in which an interface state density and doping level are calculated using said flat band voltage and said inversion threshold voltage and a subthreshold slope number, and a buried oxide (BOX) charge is calculated from said flat band voltage.

8. The method of claim 1, in which measurements of said drain current versus said drain voltage and a gate voltage are carried out at different time periods and final values of transconductance and electron mobility are recorded from their peak values, and a subthreshold slope number and an interface state density are recorded from their lowest values and hole mobility, flat band voltage, inversion threshold voltage, buried oxide charge, and doping level are recorded from their final values.

9. The method of claim 1, in which measurements of said drain current versus said drain voltage are carried out at different time periods after HF acid surface treatment which is performed to obtain proper FET behavior, low field electron mobility is measured at early time periods, and hole mobility, flat band condition, doping level, and buried oxide charge are measured at later time periods.

10. The method of claim 1, in which said measurements and said analysis are carried out by computer automated apparatus and analyses algorithms.

11. The method of claim 1, including analyzing linear and saturation behavior of the pseudo-FET to obtain electrical parameters comprising one or more of electron and hole mobilities, drive currents, transconductances, buried oxide (BOX) charge, interface state charge, and doping levels.

12. A method for analyzing and determining electrical parameters of a liquid metal-based pseudo-FET made on a silicon-on-insulator substrate comprising:

creating an ohmic gate contact to a substrate side of a test sample of the silicon-on-insulator substrate;

treating a Si film surface of said test sample to remove native oxide and reduce surface states;

contacting said Si film surface with two liquid metallic electrodes which act as source and drain electrodes;

placing a low bias drain voltage in the range of 50 to 300 millivolts between said source and drain electrodes;

placing a plurality of fixed voltage biases on said gate contact, while applying sufficient voltage biases on said drain electrode to produce saturation drain current behavior;

recording values of the drain current at each said gate voltage and each drain voltage; and performing an analysis of said drain voltage versus gate voltage measurements to determine electrical parameters of the liquid metal based pseudo-FET made on a silicon-on-insulator substrate.

13. The method of claim 12, for analyzing and determining electrical parameters of a mercury-based pseudo-FET made on a silicon-on-insulator substrate.

14. The method of claim 12, wherein the analyses include:

calculating output conductances equal to the change of said drain current versus said drain voltage for each fixed value of said gate voltage.

15. The method of claim 14, wherein the analyses include:

calculating saturated drain voltage and saturated drain current using fitting criteria to said output conductances;

calculating the saturation threshold voltage from said saturated drain current values;

calculating linear mobility and saturation mobility from the said saturated drain currents, said output conductances, and said saturation threshold voltage;

calculating saturation transconductances from the said saturated drain currents and said gate voltages.

16. The method of claim 12, wherein the analyses include:

calculating a normalized value of said gate voltage by normalizing to a chosen said gate voltage and chosen buried oxide thickness.

17. The method of claim 12, wherein the analyses include:

calculating extrapolated values of drive current and transconductance.

18. The method of claim 12, wherein the analyses include:

calculating the output conductance for some chosen set of said gate voltage and said drain voltage conditions.

19. The method of claim 12, wherein the analyses include:

calculating linear conductance near zero drain voltage.

20. The method of claim 12 in which said measurements and said analyses means are carried out by computer automated apparata and analyses algorithms.

* * * * *